United States Patent
Dornhof

(10) Patent No.: US 7,119,504 B2
(45) Date of Patent: Oct. 10, 2006

(54) PROTECTIVE CIRCUIT FOR REDUCING ELECTRICAL DISTURBANCES DURING OPERATION OF A DC MOTOR

(76) Inventor: Konstantin Dornhof, Beethovenstrasse 7, Immendingen, D-78194 (DE)

( * ) Notice: Subject to any disclaimer, the term of this patent is extended or adjusted under 35 U.S.C. 154(b) by 0 days.

(21) Appl. No.: 11/142,206

(22) Filed: May 31, 2005

(65) Prior Publication Data

US 2005/0275358 A1    Dec. 15, 2005

(30) Foreign Application Priority Data

Jun. 14, 2004    (DE) ............... 10 2004 029 049

(51) Int. Cl.
*H02P 5/46*    (2006.01)
(52) U.S. Cl. ............. 318/109; 318/108; 318/442
(58) Field of Classification Search ........ 318/108–110, 318/442
See application file for complete search history.

(56) References Cited

U.S. PATENT DOCUMENTS

| | | | |
|---|---|---|---|
| 5,377,094 A * | 12/1994 | Williams et al. | 363/132 |
| 5,513,058 A * | 4/1996 | Hollenbeck | 361/36 |
| 6,891,342 B1 * | 5/2005 | Nakamura et al. | 318/77 |
| 2003/0174528 A1 * | 9/2003 | Wong et al. | 363/147 |
| 2004/0027105 A1 | 2/2004 | Nakam et al. | |
| 2005/0041350 A1 * | 2/2005 | Horng et al. | 361/91.1 |

FOREIGN PATENT DOCUMENTS

| | | |
|---|---|---|
| DE | 195 02 016 C1 | 7/1996 |
| DE | 102 32 716 A1 | 4/2004 |
| JP | 2003-133 928 | 5/2003 |

OTHER PUBLICATIONS

Patent Abstracts of Japan, English abs. of NAGAI/RICOH JP 57-091 481, pub. Jun. 7, 1982.
Patent Abstracts of Japan, English abs. of Yoshimura/Denso Corp., JP2003-133 928, pub. May 9, 2003.

* cited by examiner

*Primary Examiner*—Rina Duda
*Assistant Examiner*—Tyrone Smith
(74) *Attorney, Agent, or Firm*—Milton Oliver, Esq.; Ware Fressola Van Der Sluys & Adolphson LLP

(57) ABSTRACT

A protective circuit, for reducing electrical disturbances or interference during operation of a DC motor, features a series transistor (62) arranged in a supply lead from a DC voltage source (12) to a DC motor; an auxiliary voltage source (52), associated with that series transistor, having a substantially constant auxiliary voltage which is configured to make the series transistor (62) fully conductive when a supply voltage furnished by the DC voltage source is substantially free of electrical interference; and an analyzer circuit (32, 34, 36) for analyzing the supply voltage, which analyzer circuit is configured, upon the occurrence of electrical interference in the supply voltage, to increase the resistance of the series transistor (62) correspondingly, in order to reduce the influence of that electrical interference on the operation of the DC motor.

31 Claims, 5 Drawing Sheets

US 7,119,504 B2

PROTECTIVE CIRCUIT FOR REDUCING ELECTRICAL DISTURBANCES DURING OPERATION OF A DC MOTOR

FIELD OF THE INVENTION

The present invention is directed to a protective circuit for reducing electrical disturbances during operation of a DC motor, and to a DC motor having a corresponding protective circuit.

BACKGROUND

During the operation of DC motors, the occurrence of electrical interference or disturbances constitutes a problem. In particular, the occurrence of electrical interference, in control circuits that are configured for electronic commutation of currents flowing in a DC motor, can negatively affect control of the DC motor. Such electrical disturbances or interference encompasses both high-energy transient pulses and low-voltage interference in the frequency range from 50 Hz to 20 kHz, with amplitudes of 6 V peak-to-peak.

Protective circuits used in the existing art encompass varistors and LC filters or filter capacitors to protect DC motors from electrical interference. The varistors serve to absorb the high-energy transient pulses, and the LC filters or filter capacitors serve to filter out low-voltage interference. The necessary size, restricted working temperature, and limited service life of LC filters or filter capacitors, however, makes them complicated to use and of only limited utility. The use of varistors is complex and cost-intensive because of the varistor dimensions that are required.

SUMMARY OF THE INVENTION

It is an object of the present invention to provide an improved protective circuit for reducing electrical disturbances during operation of a DC motor. This object is achieved by a protective circuit which includes a series transistor 62 arranged in a supply lead from a DC voltage source 12 to the DC motor, an auxiliary voltage source 52, associated with that series transistor, applying a substantially constant auxiliary voltage which is configured to make the series transistor 62 fully conductive when a supply voltage furnished by the DC voltage source is substantially free of electrical interference, and an analyzer circuit for analyzing the supply voltage, the analyzer circuit being configured, upon the occurrence of electrical interference in the supply voltage, to increase the resistance of the series transistor 62 correspondingly, in order to reduce the influence of that electrical interference on the operation of the DC motor.

The invention is based on the recognition that a reduction in electrical interference during the operation of DC motors can be achieved by means of an active protective circuit. An active protective circuit is preferably implemented using an analyzer circuit, a power controller, and a drive circuit for the power controller. A basic idea of the invention is that the drive circuit drives the power controller in such a way that the power controller influences an input voltage of the protective circuit that is affected by interference, in order to deliver to an associated DC motor a supply voltage that is substantially free of electrical interference. The analyzer circuit, which analyzes the input voltage and detects the electrical interference in that input voltage, is provided for that purpose.

According to a preferred embodiment of the invention, the power controller is implemented as a series transistor. The drive circuit causes the series transistor to be fully conductive when the input voltage is substantially free of electrical interference. As a result, the input voltage is delivered to the DC motor, substantially without losses, as the supply voltage. Upon the occurrence of electrical interference in the form of transient pulses, the drive circuit causes the series transistor to limit the amplitude, of the supply voltage generated by the protective circuit, to a predetermined value.

According to a further preferred embodiment, the analyzer circuit encompasses an RC element. In the context of electrical interference in the form of low voltages having frequencies of 50 Hz to 20 kHz in the input voltage, the RC element filters out the frequency components.

The present invention makes possible a reduction in electrical interference during the operation of DC motors using a comparatively simple and low-cost protective circuit. The invention is not limited to a specific type of motor.

BRIEF FIGURE DESCRIPTION

Further details and advantageous refinements of the invention are evident from the exemplifying embodiments described below and shown in the drawings, in which.

Figure 2:
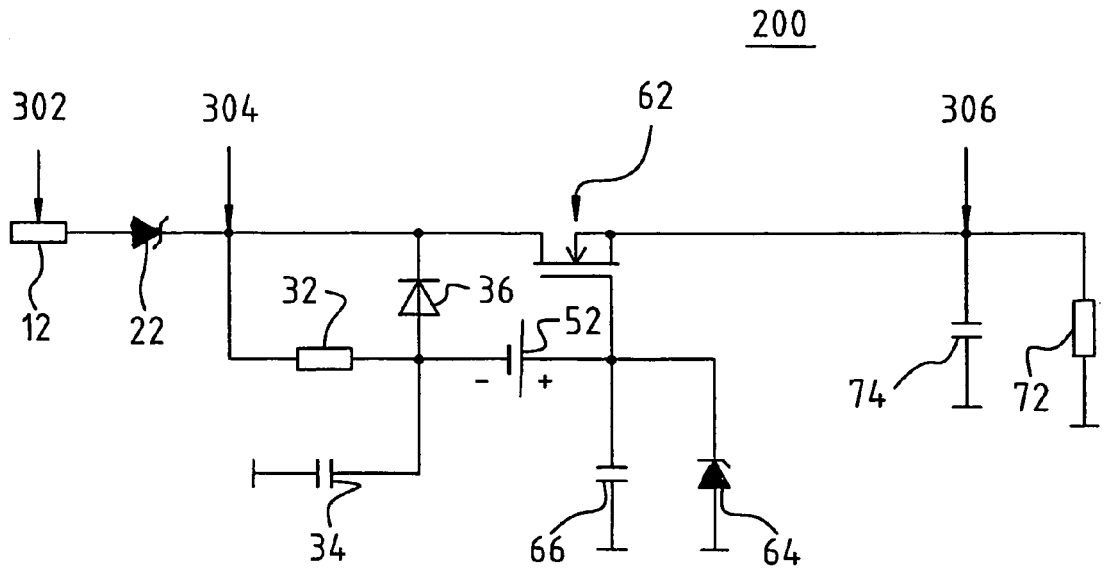
FIG. 2 is a highly simplified circuit diagram of a protective circuit for reducing electrical interference, according to a first embodiment of the invention.
Figure 3:
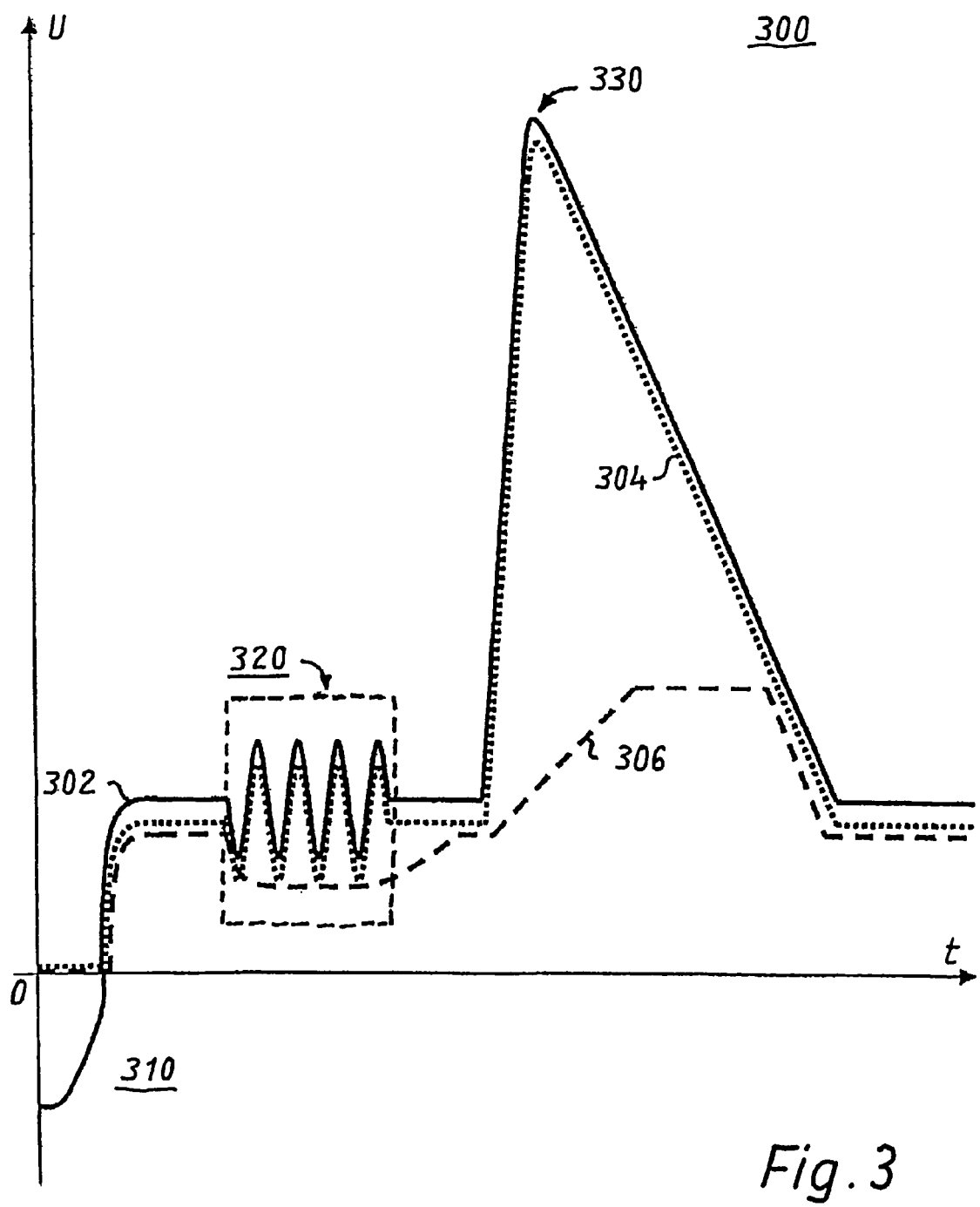
Figure 4:
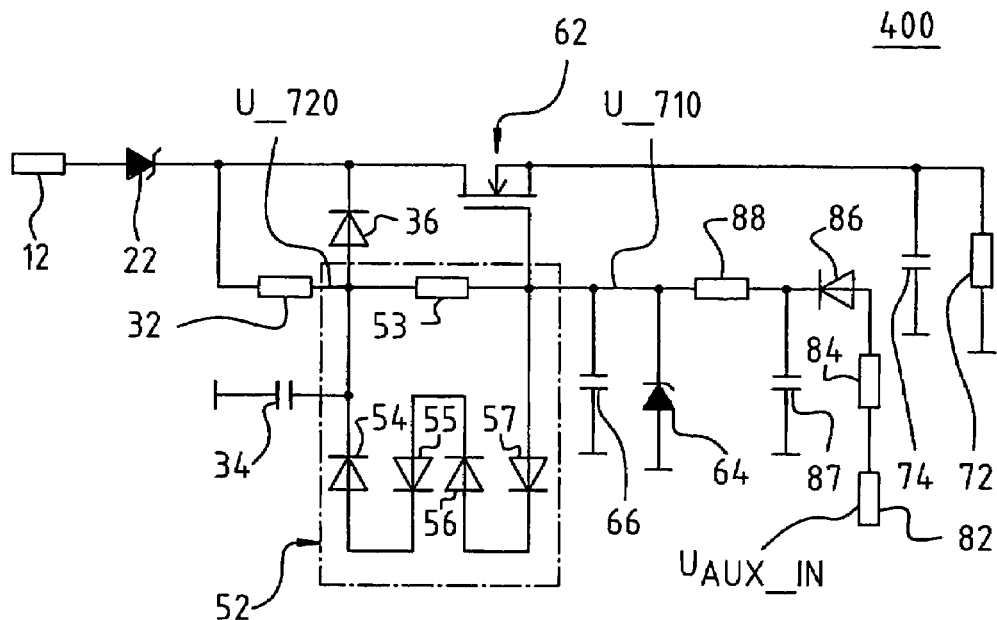
Figure 5:
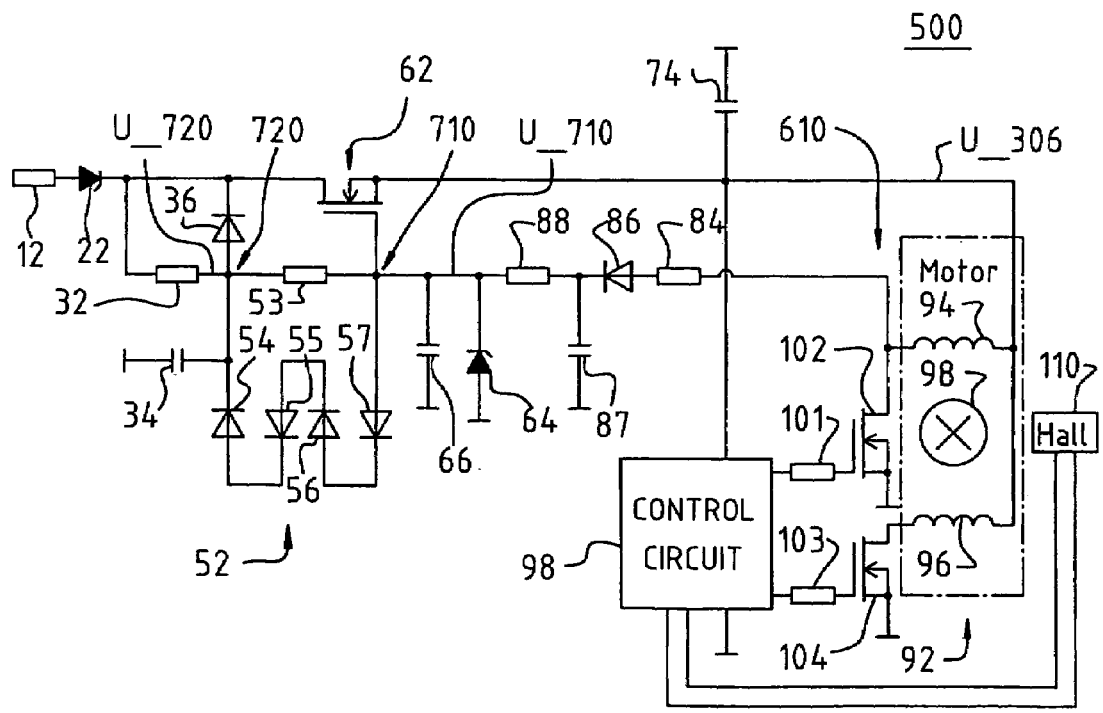
Figure 6:
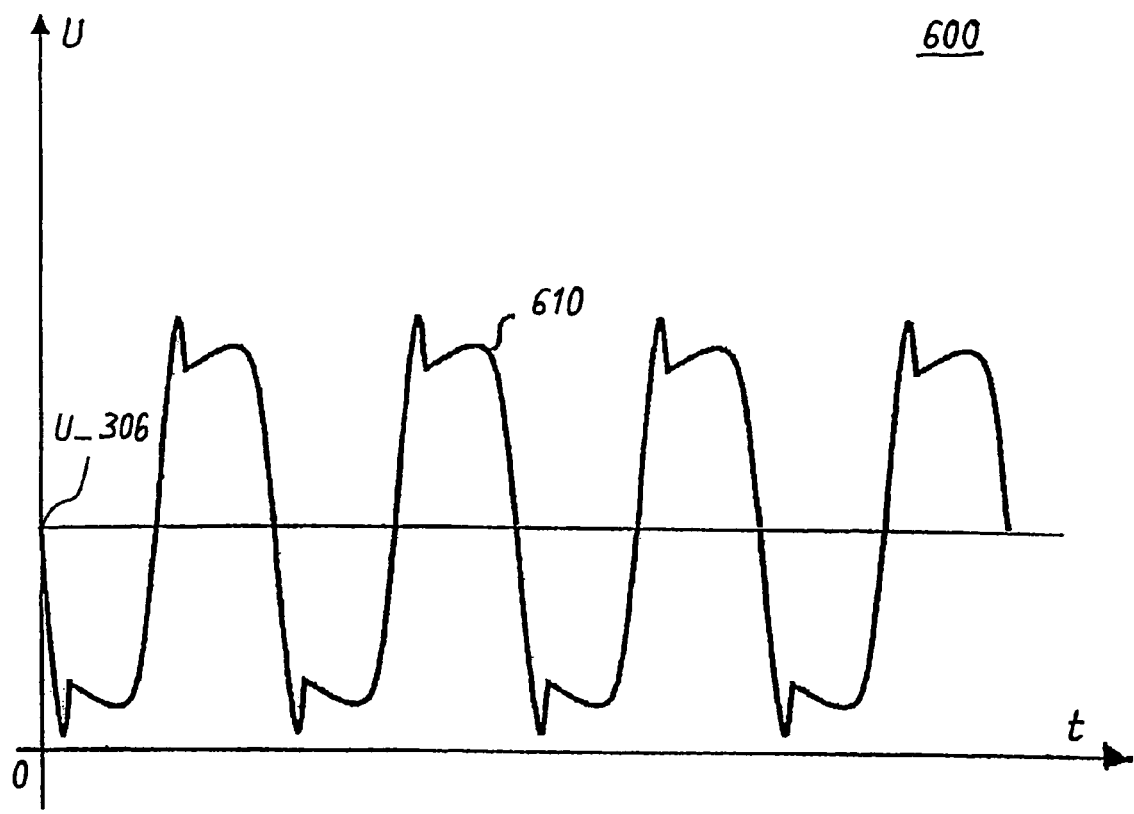
Figure 7:
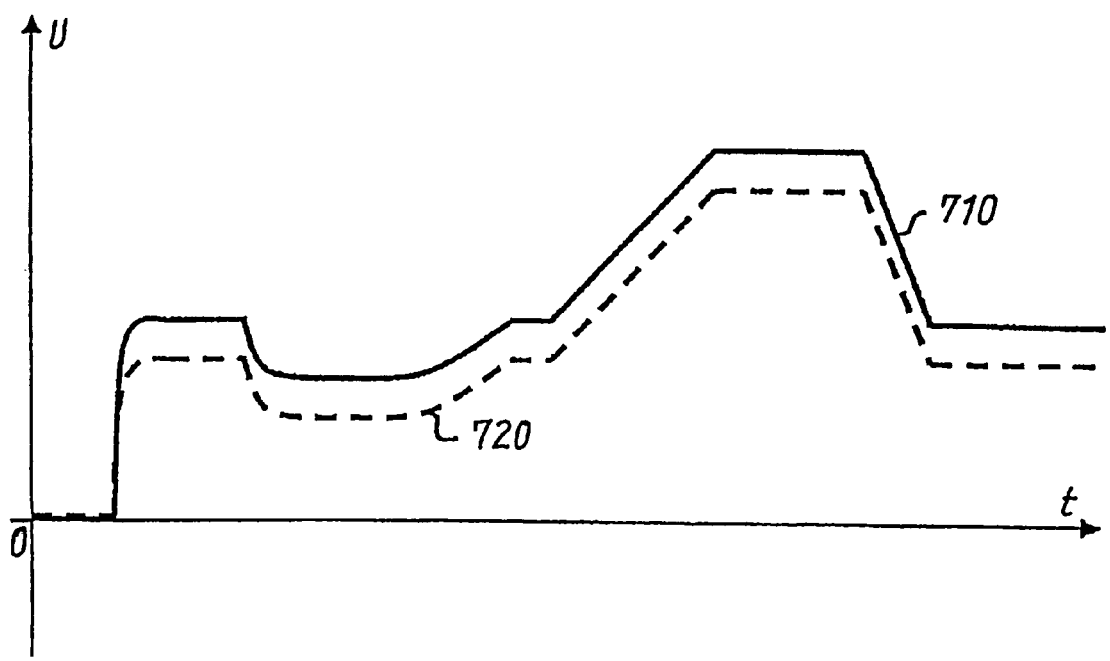

FIG. 3 schematically depicts an input and an output voltage of the protective circuit of FIG. 2, according to an embodiment of the invention;

FIG. 4 is a simplified circuit diagram of a protective circuit for reducing electrical interference, according to a second embodiment of the invention;

FIG. 5 is a simplified circuit diagram of a DC motor having the protective circuit of FIG. 4;

FIG. 6 schematically depicts a voltage induced in the winding phases of the DC motor of FIG. 5; and FIG. 7 schematically shows an auxiliary voltage generated at a diode circuit of FIG. 5, according to an embodiment of the invention.

DETAILED DESCRIPTION

Figure 1:
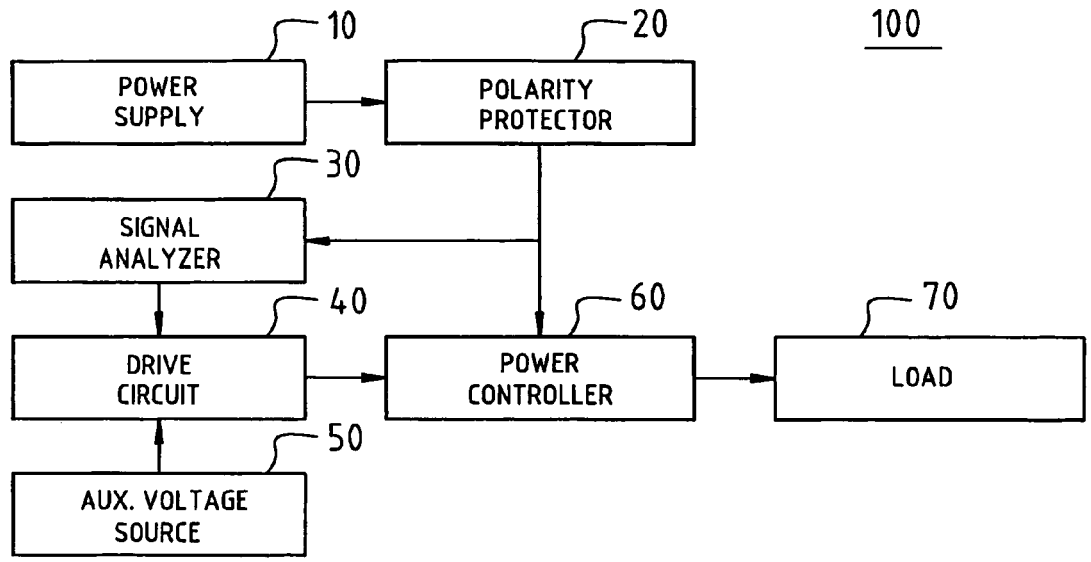
FIG. 1 is a block diagram of a protective circuit for reducing electrical interference, according to the present invention.

FIG. 1 is a block diagram illustrating the operating principle of a protective circuit 100 according to the present invention. Protective circuit 100 according to the present invention is adapted to reduce electrical interference, in an output signal of a power supply 10, during operation of a load 70. For that purpose, protective circuit 100 delivers the output signal of power supply 10 via a polarity protector 20 to an analyzer circuit 30 and a power controller 60.

A drive circuit 40 receives the output signal of analyzer circuit 30 and the output signal of an auxiliary voltage source 50. Drive circuit 40 is connected on the output side to power controller 60. The output signal of power controller 60 is delivered to load 70, and is substantially free of electrical interference.

According to a preferred embodiment of the present invention, power supply 10 provides a supply voltage necessary for the operation of load 70. In order to prevent incorrect voltage polarity or negative voltage interference at load 70, the supply voltage is delivered to polarity protector 20. Polarity protector 20 cancels out signal components that result from negative voltage interference, and blocks any signal transmission in the event of an incorrect supply voltage polarity. As a result, only a supply voltage having a correct polarity is delivered via polarity protector 20 to analyzer circuit 30 and power controller 60, negative voltage interference in the supply voltage being blocked.

Analyzer circuit 30 analyzes the supply voltage and controls drive circuit 40. Drive circuit 40 controls power controller 60 using a substantially constant auxiliary voltage from auxiliary voltage source 50. More specifically, drive circuit 40 is regulated by analyzer circuit 30 in such a way that power controller 60 delivers an interference-free supply voltage, substantially without losses, to load 70. Upon the occurrence of electrical interference in the supply voltage, drive circuit 40 is appropriately adapted to reduce the influence of that electrical interference on load 70 using power controller 60. Power controller 60 thus allows substantially interference-free energy to be delivered to load 70, and allows voltage pulses harmful to load 70, for example high-energy transient pulses, to be sufficiently damped.

FIG. 2 is a highly simplified circuit diagram of an illustrative protective circuit 200 for reducing electrical interference, according to a first embodiment of the present invention. The illustrative protective circuit 200 comprises a supply voltage source 12 and a load 72, shown schematically as a resistor. A positive line of supply voltage source 12 is connected to the anode side of a diode 22. The output signal of diode 22 is delivered from the cathode side of diode 22 through a resistor 32 to the negative pole of an auxiliary voltage source 52. The output signal of diode 22 is furthermore delivered to the cathode side of a diode 36 and to the drain region of a series transistor (MOSFET) 62. The anode side of diode 36 and the negative pole of auxiliary voltage source 52 are connected to ground via a storage capacitor 34. The positive pole of the auxiliary voltage source is connected to the gate of series transistor 62. The positive pole of auxiliary voltage source 52 is furthermore connected to ground via a storage capacitor 66 and a Zener diode 64 arranged in parallel with storage capacitor 66. The source region of the series transistor is connected to ground, on the one hand, through load 72 and, on the other hand, through a link circuit capacitor 74.

According to a preferred embodiment of the present invention, diode 22 constitutes a polarity protector (e.g. polarity protector 20 of FIG. 1) that prevents incorrectly polarized connection of load 72.

Series transistor 62, storage capacitor 66, and Zener diode 64 constitute a power controller (e.g. power controller 60 of FIG. 1). Resistor 32, capacitor 34, and diode 36 constitute an analyzer circuit (e.g. analyzer circuit 30 of FIG. 1). A diode voltage dropping across diode 36, and a substantially constant auxiliary voltage generated by auxiliary voltage source 52 (e.g. auxiliary voltage source 50 of FIG. 1), constitute a drive means (e.g. drive circuit 40 of FIG. 1) for series transistor 62 (or power controller 60). The manner of operation of protective circuit 200 will be explained in more detail below.

Supply voltage source 12 makes an input voltage 302 available to protective circuit 200. Input voltage 302 is preferably a substantially constant DC voltage, having an amplitude of +13.2 V, that is generated by a power supply unit or a battery. Diode 22 is conductive only for an input voltage having a correct polarity, negative voltage interference in the input voltage being blocked. An illustrative input voltage 302 is depicted in FIG. 3. From input voltage 302 of FIG. 3, diode 22 generates a voltage 304 that is likewise depicted in FIG. 3. Voltage 304 causes a voltage drop at diode 36 that results in the creation of a corresponding diode voltage. The sum of the diode voltage and the auxiliary voltage generated by auxiliary voltage source 52 constitutes a control voltage for series transistor 62. The auxiliary voltage is preferably a substantially constant DC voltage having an amplitude of +2 V. The control voltage is preferably configured in such a way that it corresponds approximately to the switching threshold of series transistor 62. The control voltage is thus implemented so as to make series transistor 62 fully conductive in the ohmic range when an input voltage 302 furnished by the supply voltage source is substantially free of electrical interference. This is also referred to as operation in the low-loss state.

Upon the occurrence, in input voltage 302 and thus in voltage 304, of electrical interference in the low-voltage range at frequencies from about 50 Hz to about 20 kHz, an RC element constituted by resistor 32 and capacitor 34 is activated. The RC element filters the frequency components of the low-voltage interference out of voltage 304. Filtering out the frequency components results in a negative voltage deviation in voltage 304. This negative voltage deviation influences the diode voltage at diode 36, in such a way that the control voltage is lowered, whereupon series transistor 62 operates in the ohmic range as a resistor. Series transistor 62 thereby lowers the supply voltage at load 72 for as long as the low-voltage interference is occurring. Once the low-voltage interference has died down, the control voltage rises again and series transistor 62 is once again made fully conductive.

Upon the occurrence, in input voltage 302 and thus in voltage 304, of electrical interference in the form of transient pulses with voltage pulses of up to +100V, diode 36 blocks. This causes protective circuit 200 to function as a power supply unit, with an output voltage that is made available by storage capacitor 66 and is limited by Zener diode 64 to the Zener diode voltage. In other words, upon the occurrence of high-energy transient pulses, the magnitude of voltage 304 is limited by Zener diode 64 to a predetermined value. Zener diode 64 is preferably dimensioned in such a way that this predetermined value is approximately 25% higher than the value of voltage 304 without interference. The result is that Zener diode 64 is activated exclusively when high-energy transient pulses occur. When input voltage 302 is free of interference, Zener diode 64 has no effect on the operation of protective circuit 200.

A supply voltage 306 is accordingly present at the output of protective circuit 200 and thus at load 72. In supply voltage 306, electrical interference—in the form of high-energy transient pulses and low voltages with frequencies from 50 Hz to 20 kHz—is reduced as compared with voltage 304. An illustrative supply voltage 306 is also depicted in FIG. 3.

FIG. 3 shows a schematic representation 300 of examples of changes over time in voltages 302, 304, and 306 of FIG. 2.

Input voltage 302 represents a nominal voltage for the operation of load 72. Input voltage 302 exhibits a region 310 that represents, for example, a negative voltage component, i.e. an input voltage with incorrect polarity. Input voltage 302 moreover exhibits a region 320 that illustrates, by way of example, low-voltage interference. Input voltage 302 moreover exhibits a region 330 that illustrates, by way of example, a high-energy transient pulse.

Voltage 304 corresponds to input voltage 302 from which the negative voltage component in region 310 has been removed by the polarity protector constituted by diode 22, and from which the diode voltage of diode 22 has been subtracted.

Supply voltage 306 corresponds to voltage 304 in which the low-voltage interference in region 320 and the transient pulse in region 330 have been reduced. As compared with voltage 304, supply voltage 306 is reduced in region 320 after the frequency components of the low-voltage interference have been filtered out and the control voltage of series transistor 62 has been lowered, as described above. In addition, the transient pulse in region 330 has not been completely removed from voltage 304, but instead merely reduced in supply voltage 306 substantially to the voltage of Zener diode 64, i.e. to a DC voltage with an amplitude of approximately +15 V.

FIG. 4 is a highly simplified circuit diagram of an illustrative protective circuit 400 for reducing electrical interference, according to a second embodiment of the present invention. In protective circuit 400, a diode circuit in which, for example, four diodes 54, 55, 56, and 57 are connected in series is arranged between capacitor 34 and the gate of series transistor 62. A resistor is arranged, in parallel with the four series-connected diodes 54, 55, 56, and 57, between resistor 32 and the gate of series transistor 62. Protective circuit 400 furthermore comprises a voltage source 82 that is connected via a current limiting resistor 84 to the anode side of a diode 86. The cathode side of diode 86 is connected on the one hand via a capacitor 87 to ground, and on the other hand via a resistor 88 to the cathode side of Zener diode 64. The circuit arrangement otherwise corresponds to the one shown in FIG. 2.

In protective circuit 400, the parallel circuit of the four diodes 54, 55, 56 and 57 with resistor 53 replaces auxiliary voltage source 52 of protective circuit 200 of FIG. 2. For that purpose, the four diodes 54, 55, 56, and 57 are implemented in such a way that a voltage drop occurs at them which substantially corresponds to the auxiliary voltage of auxiliary voltage source 52. A voltage of approximately +0.5 V must therefore be produced at each of the four diodes in order to achieve, for example, a voltage drop of +2 V. As an alternative to the series circuit of the four diodes 54, 55, 56, and 57, a correspondingly dimensioned Zener diode or light-emitting diode, or a combination of different diode types, can also be used.

The voltage drop at diodes 54, 55, 56, and 57 is made possible by the provision of an auxiliary voltage U_AUX_IN, with an amplitude of approximately +18 V, at voltage source 82. Resistor 84 applies a current limitation in order to protect downstream elements. The effect of diode 86 is that only an increase in voltage U_710 at capacitor 66 can take place as a result of auxiliary voltage U_AUX_IN (charge pump principle). In addition, the auxiliary voltage U_AUX_IN is smoothed by the R/C combination constituted by capacitor 87 and resistor 88.

Examples of values for the components of FIG. 4 (and FIG. 5) are:

| | |
|---|---|
| Diode 22 | D1FM3 |
| Diode 36 | 1N4148 |
| Diodes 54–57 | 1N4148 |
| Diode 86 | 1N4148 |
| Capacitor 34 | 1 uF |
| Capacitor 66 | 10 nF |
| Capacitor 74 | 100 nF |
| Capacitor 87 | 100 nF |
| MOSFET 62 | IRLR3410 |

-continued

| | |
|---|---|
| Resistor 32 | 510 kilohm |
| Resistor 53 | 510 kilohm |
| Resistor 84 | 10 kilohm |
| Resistor 88 | 100 kilohm |
| Zener diode 64 | 20 V Zener diode voltage |

FIG. 5 is a simplified circuit diagram of an illustrative circuit 500 in which load 72 of the protective circuit of FIG. 4 is implemented as a DC motor arrangement. FIG. 5 accordingly depicts, by way of example, a two-phase electric motor 92 that can be connected to the protective circuit according to the present invention, in order to reduce electrical interference.

The electronically commutated DC motor 92 comprises two stator winding phases 94, 96 and a permanent-magnet rotor (only symbolically shown). A Hall sensor 110 is arranged in the vicinity of the rotor. Phase 94 is connected to the drain terminal of a first output stage transistor 102 (Metal Oxide Semiconductor Field Effect Transistor or "MOSFET"), and phase 96 to the drain terminal of a second output stage transistor 104 (MOSFET). Phases 94 and 96 are connected on the one hand via link circuit capacitor 74 to ground GND, and on the other hand to the source terminal of series transistor 62. Phases 94, 96 are usually coupled to one another in transformer fashion via the iron of the stator lamination stack. The gate terminal of output stage transistor 102 is connected via a current limiting resistor 101, and the gate terminal of output stage transistor 104 via a current limiting resistor 103, to a control circuit 98 for electronic commutation of the motor currents. Hall sensor 110 is likewise connected to control circuit 98. The source terminals of output-stage transistors 94, 96 are connected to ground.

Upon energization of motor 92, voltages occur in winding phases 94, 96 of motor 92; these voltages include of voltages induced by the rotor magnets, transformer voltages resulting from the opposite winding, and voltages produced by the flow of current. These voltages form a signal 610 that, in certain regions, is greater than supply voltage 12.

FIG. 6 provides a schematic representation 600 of an illustrative change over time in signal 610 at a high motor power level. Voltage 610 is greater than supply voltage U_306 at certain points, and can therefore be used to generate auxiliary voltage U_710 (see FIG. 5). As described above, a current limitation of signal 610 is accomplished by current limiting resistor 84. The current resulting from signal 610 can flow only toward capacitor 66 because of diode 86, and the R/C combination of capacitor 87 and resistor 88 acts as a low-pass filter. A signal 710 for generating the auxiliary voltage is thus applied to the diode circuit comprising the four diodes 54, 55, 56, and 57. Diode circuit 52, along with diodes 54 through 57 and resistor 53, causes voltage U_710 at point 710, which serves as the auxiliary voltage for series transistor 62, to "track" voltage U_720 and thus to make series transistor 62 conductive. A schematic representation 700 of an illustrative change over time in signals 710 and 720 is shown in FIG. 7.

The result of the protective circuit according to FIG. 5 is that interference in the low-voltage region, and interference resulting from transient pulses, is effectively eliminated. It is particularly advantageous in this context that the auxiliary voltage for controlling the series transistor or MOSFET 62, which voltage must be greater than supply voltage 12, is generated without an additional voltage source in the form of a battery, etc. Generation of the auxiliary voltage by means of the voltage at a motor winding 94 yields a dependable solution that is maintenance-free in terms of the auxiliary voltage.

Many variants and modifications are of course possible within the scope of the present invention.

What is claimed is:

1. A circuit, for reducing electrical disturbances during the operation of a DC motor, comprising:
   a series transistor (62) arranged in a supply lead from a DC voltage source (12) to a DC motor;
   an auxiliary voltage source (52), associated with that series transistor, having a substantially constant auxiliary voltage, which source is configured to make the series transistor fully conductive when a supply voltage furnished by the DC voltage source, is substantially free of electrical interference;
   an analyzer circuit (32, 34, 36) for analyzing the supply voltage, which analyzer circuit is configured, upon occurrence of electrical interference in the supply voltage, to increase the resistance of the series transistor correspondingly, in order to reduce the influence of that electrical interference on the operation of the DC motor;
   wherein the analyzer circuit (32, 34, 36) comprises
   a diode (36) connected between the auxiliary voltage source (52) and a first conduction electrode of the series transistor (62), at which diode there occurs a diode voltage that, together with the auxiliary voltage, constitutes a control voltage for controlling the series transistor, the diode (36) being configured to vary the control voltage in such a way that
   fully conductive operation of the series transistor (62), in the ohmic range, occurs when the supply voltage furnished by the DC voltage source is substantially free of electrical interference.

2. The circuit of claim 1, further comprising
   a control circuit (98) for a DC motor which receives, from said analyzer circuit, a substantially interference-free supply voltage, and which generates output signals for electronic commutation (102, 104) of currents flowing in the DC motor.

3. The circuit of claim 1, further comprising
   circuit means for deriving said auxiliary voltage from an induced voltage (610) that occurs, during operation of the DC motor, in at least one winding phase (94) of the DC motor.

4. The circuit of claim 2, further comprising
   circuit means for deriving said auxiliary voltage from an induced voltage (610) that occurs, during operation of the DC motor, in at least one winding phase (94) of the DC motor.

5. The circuit of claim 3, wherein the auxiliary voltage source comprises a diode circuit (54–57) which is adapted to derive the auxiliary voltage from the induced voltage.

6. The circuit of claim 4, wherein the auxiliary voltage source comprises a diode circuit (54–57) which is adapted to derive the auxiliary voltage from the induced voltage.

7. The circuit of claim 1, wherein
   the series transistor (62) is a field-effect transistor, and the first conduction electrode is the drain of the field-effect transistor.

8. The circuit of claim 2, wherein the series transistor (62) is a field-effect transistor, and the first conduction electrode is the drain of the field-effect transistor.

9. The circuit of claim 3, wherein the series transistor (62) is a field-effect transistor, and the first conduction electrode is the drain of the field-effect transistor.

10. The circuit of claim 4, wherein the series transistor (62) is a field-effect transistor, and the first conduction electrode is the drain of the field-effect transistor.

11. The circuit of claim 1,
    wherein the diode (36) is configured to switch the series transistor (62) to a higher resistance state upon occurrence of electrical interference, in the form of transient pulses, in the supply voltage.

12. The circuit according to claim 1, further comprising
    a Zener diode (64) connected between ground and a second conduction electrode of the series transistor (62), wherein said Zener diode is configured to limit a magnitude, of the supply voltage generated by the circuit, to a predetermined value.

13. The circuit according to claim 8,
    wherein the series transistor (62) is a field-effect transistor, and the second conduction electrode is the gate of the field-effect transistor.

14. The circuit of claim 1, wherein
    the analyzer circuit (32, 34, 36) comprises an RC element (32, 34) which is configured to filter out electrical interference, in the supply voltage, in the form of low voltages having frequencies within a range from about 50 Hz to about 20 kHz.

15. The circuit of claim 1, further comprising
    a polarity protector (20, 22) interposed between said DC voltage source (12) and said analyzer circuit (30).

16. A circuit, for reducing electrical disturbances during the operation of a DC motor, comprising:
    a series transistor (62) arranged in a supply lead from a DC voltage source (12) to a DC motor;
    an auxiliary voltage source (52), associated with that series transistor, having a substantially constant auxiliary voltage, which source is configured to make the series transistor fully conductive when a supply voltage furnished by the DC voltage source is substantially free of electrical interference;
    an analyzer circuit (32, 34, 36) for analyzing the supply voltage, which analyzer circuit is configured, upon occurrence of electrical interference in the supply voltage, to increase the resistance of the series transistor correspondingly, in order to reduce the influence of that electrical interference on the operation of the DC motor;
    wherein the analyzer circuit (32, 34, 36) comprises
    a diode (36) connected between the auxiliary voltage source (52) and a first conduction electrode of the series transistor (62), at which diode there occurs a diode voltage that, together with the auxiliary voltage, constitutes a control voltage for controlling the series transistor, the diode (36) being configured to switch the series transistor (62) to a higher resistance state upon occurrence of electrical interference, in the form of transient pulses, in the supply voltage.

17. The circuit of claim 16, further comprising
    a control circuit (98) for a DC motor which receives, from said analyzer circuit, a substantially interference-free supply voltage, and which generates output signals for electronic commutation (102, 104) of currents flowing in the DC motor.

18. The circuit of claim 16, further comprising
circuit means for deriving said auxiliary voltage from an induced voltage (610) that occurs, during operation of the DC motor, in at least one winding phase (94) of the DC motor.

19. The circuit of claim 17, further comprising
circuit means for deriving said auxiliary voltage from an induced voltage (610) that occurs, during operation of the DC motor, in at least one winding phase (94) of the DC motor.

20. The circuit of claim 18, wherein the auxiliary voltage source comprises a diode circuit (54–57) which is adapted to derive the auxiliary voltage from the induced voltage.

21. The circuit of claim 19, wherein the auxiliary voltage source comprises a diode circuit (54–57) which is adapted to derive the auxiliary voltage from the induced voltage.

22. The circuit of claim 16, wherein the series transistor (62) is a field-effect transistor, and the first conduction electrode is the drain of the field-effect transistor.

23. The circuit of claim 17, wherein the series transistor (62) is a field-effect transistor, and the first conduction electrode is the drain of the field-effect transistor.

24. The circuit of claim 18, wherein the series transistor (62) is a field-effect transistor, and the first conduction electrode is the drain of the field-effect transistor.

25. The circuit of claim 21, wherein the series transistor (62) is a field-effect transistor, and the first conduction electrode is the drain of the field-effect transistor.

26. The circuit of claim 16,
wherein the diode (36) is configured to switch the series transistor (62) to a higher resistance state upon occurrence of electrical interference, in the form of transient pulses, in the supply voltage.

27. The circuit of claim 16, further comprising
a Zener diode (64) connected between ground and a second conduction electrode of the series transistor (62), wherein said Zener diode is configured to limit a magnitude, of the supply voltage generated by the circuit, to a predetermined value.

28. The circuit according to claim 17, wherein the series transistor (62) is a field-effect transistor, and the second conduction electrode is the gate of the field-effect transistor.

29. The circuit of claim 16, wherein
the analyzer circuit (32, 34, 36) comprises an RC element (32, 34) which is configured to filter out electrical interference, in the supply voltage, in the form of low voltages having frequencies within a range from about 50 Hz to about 20 kHz.

30. The circuit of claim 16, further comprising
a polarity protector (20, 22) interposed between said DC voltage source (12) and said analyzer circuit (30).

31. A circuit, for reducing electrical disturbances during the operation of a DC motor, comprising:
a series transistor (62) arranged in a supply lead from a DC voltage source (12) to a DC motor;
an auxiliary voltage source (52), associated with that series transistor, having a substantially constant auxiliary voltage, which source is configured to make the series transistor fully conductive when a supply voltage furnished by the DC voltage source is substantially free of electrical interference;
an analyzer circuit (32, 34, 36) for analyzing the supply voltage, which analyzer circuit is configured, upon occurrence of electrical interference in the supply voltage, to increase the resistance of the series transistor correspondingly, in order to reduce the influence of that electrical interference on the operation of the DC motor;
wherein the analyzer circuit (32, 34, 36) comprises
a diode (36) connected between the auxiliary voltage source (52) and a first conduction electrode of the series transistor (62), having a diode voltage that is selected such that it lowers said auxiliary voltage sufficiently to operate the series transistor conductively in the ohmic range.

* * * * *